United States Patent
Wang et al.

(10) Patent No.: US 12,436,428 B2
(45) Date of Patent: Oct. 7, 2025

(54) LIGHT-EMITTING SUBSTRATE, BACKLIGHT MODULE, AND DISPLAY APPARATUS

(71) Applicants: Hefei BOE Ruisheng Technology Co., Ltd., Anhui (CN); BOE TECHNOLOGY GROUP CO., LTD., Beijing (CN)

(72) Inventors: Jie Wang, Beijing (CN); Xintao Wu, Beijing (CN); Wenzhuo Tang, Beijing (CN); Zouming Xu, Beijing (CN)

(73) Assignees: HEFEI BOE RUISHENG TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/638,711

(22) Filed: Apr. 18, 2024

(65) Prior Publication Data
US 2024/0295774 A1 Sep. 5, 2024

Related U.S. Application Data

(63) Continuation of application No. PCT/CN2023/079652, filed on Mar. 3, 2023.

(51) Int. Cl.
G02F 1/1335 (2006.01)
G02F 1/13357 (2006.01)
(Continued)

(52) U.S. Cl.
CPC .. G02F 1/133612 (2021.01); G02F 1/133603 (2013.01); G02F 1/136204 (2013.01);
(Continued)

(58) Field of Classification Search
CPC ......... G02F 1/133612; G02F 1/133603; G02F 1/136204; G09G 3/2088; G09G 3/32;
(Continued)

(56) References Cited

U.S. PATENT DOCUMENTS

2004/0017008 A1* 1/2004 Ueda ................. H01L 22/32
257/E23.079
2013/0229401 A1 9/2013 Kim et al.
(Continued)

FOREIGN PATENT DOCUMENTS

CN 103885263 A 6/2014
CN 108681415 A 10/2018
(Continued)

OTHER PUBLICATIONS

International Search Report and Written Opinion for International Application No. PCT/CN2023/079652 issued by the International Searching Authority (China National Intellectual Property Administration) on Nov. 19, 2023.

*Primary Examiner* — Douglas Wilson
(74) *Attorney, Agent, or Firm* — XSENSUS LLP

(57) ABSTRACT

A light-emitting substrate having a functional area and a bonding area spaced apart in a first direction; the light-emitting substrate includes: a substrate, a plurality of driver chips located on the substrate and located in the functional area, and a plurality of conductive patterns located between the substrate and the plurality of driver chips. The plurality of driver chips include a plurality of first driver chips and a plurality of second driver chips; among the plurality of first driver chips, at least one first driver chip is located on at least one side of the plurality of second driver chips in the first direction. The first driver chip includes at least one dummy pin. A conductive pattern is electrically connected to a dummy pin.

20 Claims, 8 Drawing Sheets

(51) Int. Cl.
  *G09G 3/20* (2006.01)
  *G09G 3/32* (2016.01)
  *G09G 3/34* (2006.01)
  *H10H 20/857* (2025.01)
  *H10K 59/129* (2023.01)
  *G02F 1/1362* (2006.01)

(52) U.S. Cl.
  CPC ......... *G09G 3/2085* (2013.01); *G09G 3/2088* (2013.01); *G09G 3/32* (2013.01); *G09G 3/3426* (2013.01); *G09G 2300/0408* (2013.01); *G09G 2300/0426* (2013.01); *G09G 2300/0465* (2013.01); *G09G 2310/0275* (2013.01); *H05K 2201/10106* (2013.01); *H10H 20/857* (2025.01); *H10K 59/129* (2023.02)

(58) Field of Classification Search
  CPC ... G09G 2300/0408; G09G 2300/0426; G09G 2300/0465; G09G 3/2085; G09G 3/3426; G09G 2310/0275; H05K 2201/10106; H10K 59/129; H01R 13/7031; H10H 20/857

See application file for complete search history.

(56) References Cited

U.S. PATENT DOCUMENTS

| | | | |
|---|---|---|---|
| 2022/0172672 A1* | 6/2022 | Park | H01L 25/075 |
| 2023/0246152 A1* | 8/2023 | Liu | H10H 20/857 257/91 |

FOREIGN PATENT DOCUMENTS

| | | |
|---|---|---|
| CN | 115000284 A | 9/2022 |
| CN | 115241147 A | 10/2022 |
| WO | 2022/252069 A1 | 12/2022 |

\* cited by examiner

LIGHT-EMITTING SUBSTRATE, BACKLIGHT MODULE, AND DISPLAY APPARATUS

CROSS-REFERENCE TO RELATED APPLICATION

This application is a bypass continuation of International Patent Application No. PCT/CN2023/079652, filed on Mar. 3, 2023, which is incorporated herein by reference in its entirety.

TECHNICAL FIELD

The present disclosure relates to the field of display technologies, and in particular, to a light-emitting substrate, a backlight module, and a display apparatus.

BACKGROUND

The light-emitting diodes (LEDs) include mini light-emitting diodes (mini LEDs) or micro light-emitting diodes (micro LEDs); the size of the Mini LED is in a range of approximatively 80 µm to approximatively 500 µm, and the size of the micro LED is approximatively less than 80 µm.

Mini LEDs may be used for the backlight and direct display. In a case where the mini LEDs are used for the backlight, by means of densely arranged of a large number, it is possible to achieve regional dimming in a small range, and compared with the traditional backlight design, it is possible to achieve better uniformity of luminance and higher color contrast in a smaller mixing distance, thereby achieving ultra-thin, high color rendering, and power saving of the terminal products. Moreover, since the design may be used with the flexible substrate and match the curved liquid crystal display (LCD) panel, it is also possible to achieve a curved display similar to organic light-emitting diodes (OLEDs) while ensuring image quality.

In a case where the mini LEDs are used for RGB direct display, it is possible to overcome the defects of the wiring and reliability of the chip of a wire-bonding structure; moreover, combining the advantages of the encapsulation of chip on board (COB) or chip on glass (COG), it is possible to further reduce the dot pitch of the display screen and greatly improve the visual effect of the corresponding terminal products, and significantly reduce the viewing distance, so that the indoor displays may replace the original LCD market. Furthermore, due to the usage with the flexible substrate, it is also possible to achieve high-quality display effects on the curved surface; moreover, due to the characteristic of self-luminous, it has an extremely broad market in some special styling needs, such as automotive displays.

SUMMARY

In an aspect, a light-emitting substrate is provided. The light-emitting substrate has a functional area and a bonding area spaced apart in a first direction. The light-emitting substrate includes: a substrate, a plurality of driver chips located on the substrate and located in the functional area, and a plurality of conductive patterns located between the substrate and the plurality of driver chips. The plurality of driver chips include a plurality of first driver chips and a plurality of second driver chips; among the plurality of first driver chips, at least one first driver chip is located on at least one side of the plurality of second driver chips in the first direction; a first driver chip includes at least one dummy pin. A conductive pattern is electrically connected to a dummy pin.

In some embodiments, the light-emitting substrate further includes a plurality of light-emitting device groups located on the substrate. The first driver chip includes a plurality of channel pins, a channel pin is electrically connected to a light-emitting device group; among the plurality of channel pins of the first driver chip, a part of the channel pins serves as the dummy pin and is connected to no light-emitting device group.

In some embodiments, a second driver chip includes a plurality of channel pins, and a channel pin of the second driver chip is electrically connected to another light-emitting device group; a number of the channel pins included in the second driver chip is the same as a number of the channel pins included in the first driver chip; a number of light-emitting device groups connected to the second driver chip is greater than a number of light-emitting device groups connected to the first driver chip.

In some embodiments, the first driver chip includes a plurality of dummy pins, and conductive patterns connected to at least two dummy pins of the first driver chip are of a one-piece structure.

In some embodiments, the light-emitting substrate further includes a plurality of first voltage signal lines located between the substrate and the plurality of driver chips; the light-emitting device group is further electrically connected to a first voltage signal line, and the conductive pattern is not connected to the first voltage signal line.

In some embodiments, the plurality of conductive patterns and the plurality of first voltage signal lines are made of a same material and are arranged in the same layer.

In some embodiments, a minimum distance between the conductive pattern and the first voltage signal line is greater than or equal to 200 µm.

In some embodiments, the first driver chip includes a plurality of power supply voltage signal pins, and a power supply voltage signal pin is configured to receive a power supply voltage signal; among the plurality of power supply voltage signal pins of the first driver chip, a part of the power supply voltage signal pins serves as the dummy pin and is configured to receive no power supply voltage signal.

In some embodiments, the light-emitting substrate further includes a plurality of second voltage signal lines located between the substrate and the plurality of driver chips; the power supply voltage signal pin is electrically connected to a second voltage signal line, and the conductive pattern is not connected to the second voltage signal line.

In some embodiments, the conductive patterns and the plurality of second voltage signal lines are made of a same material and are arranged in a same layer.

In some embodiments, a minimum distance between the conductive pattern and the second voltage signal line is greater than or equal to 200 µm.

In some embodiments, the first driver chip includes a plurality of data signal pins, and a data signal pin is configured to receive a data signal; among the plurality of data signal pins of the first driver chip, a part of the data signal pins serves as the dummy pin and is configured to receive no data signal.

In some embodiments, the light-emitting substrate further includes a plurality of data signal lines located between the substrate and the plurality of driver chips; the data signal pin is electrically connected to a data signal line, and the conductive pattern is not connected to the data signal line.

In some embodiments, the conductive patterns and the data signal lines are made of a same material and are arranged in a same layer.

In some embodiments, a minimum distance between the conductive pattern and the data signal line is greater than or equal to 200 μm.

In some embodiments, an end of the conductive pattern away from the first driver chip is in a shape of an arc or is chamfered.

In some embodiments, an orthographic projection of the conductive pattern on the substrate is in a shape of a strip, a rectangle, a circle or an ellipse.

In some embodiments, the plurality of driver chips are arranged in columns, and each column of driver chips includes driver chips; the driver chips in each column of driver chips are cascaded in sequence.

In some embodiments, at least one first driver chip is located on one side of the plurality of second driver chips in the first direction.

In some embodiments, at least one first driver chip is closer to the bonding area than the plurality of second driver chips, and another at least one first driver chip is further away from the bonding area than the plurality of second driver chips.

In another aspect, a backlight module is provided. The backlight module includes the light-emitting substrate described in any of the above embodiments, and an optical film located on a light exit side of the light-emitting substrate.

In yet another aspect, a display apparatus is provided. The display apparatus includes: the backlight module described in the above embodiment; an array substrate located on a light exit side of the backlight module; and a color filter substrate located on a side of the array substrate away from the backlight module.

BRIEF DESCRIPTION OF THE DRAWINGS

In order to describe technical solutions in the present disclosure more clearly, the accompanying drawings to be used in some embodiments of the present disclosure will be introduced briefly. Obviously, the accompanying drawings to be described below are merely drawings of some embodiments of the present disclosure, and a person of ordinary skill in the art can obtain other drawings according to those drawings. In addition, the accompanying drawings in the following description may be regarded as schematic diagrams, and are not limitations on an actual size of a product to which the embodiments of the present disclosure relate.

DETAILED DESCRIPTION

Figure 1A:
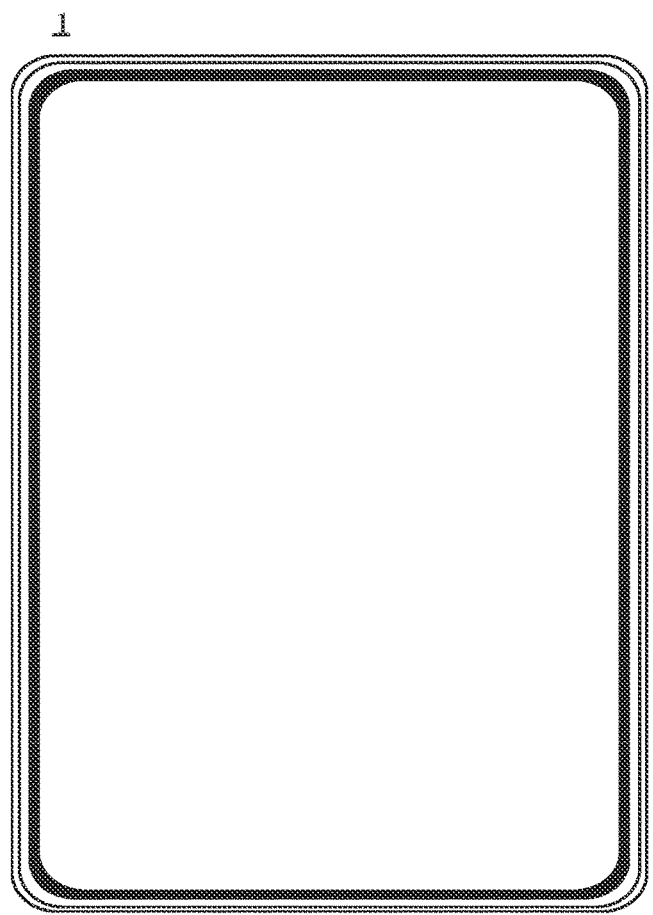
FIG. 1A is a structural diagram of a display apparatus, in accordance with some embodiments of the present disclosure.

The technical solutions in embodiments of the present disclosure will be described clearly and completely with reference to the accompanying drawings. Obviously, the described embodiments are merely some but not all of embodiments of the present disclosure. All other embodiments obtained on the basis of the embodiments of the present disclosure by a person of ordinary skill in the art shall be included in the protection scope of the present disclosure.

Unless the context requires otherwise, throughout the description and claims, the term "comprise" and other forms thereof such as the third-person singular form "comprises" and the present participle form "comprising" are construed as an open and inclusive meaning, i.e., "included, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, specific features, structures, materials, or characteristics described herein may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

Some embodiments may be described using the terms "coupled" and "connected" and their derivatives. The term "connected" should be understood in a broad sense. For example, the term "connected" may represent a fixed connection, a detachable connection or a one-piece connection, or may represent a direct connection or an indirect connection through an intermediate medium. For example, the term "connected" may be used in the description of some embodiments to indicate that two or more components are in direct physical or electrical contact with each other. The embodiments disclosed herein are not necessarily limited to the content herein.

The phrase "A and/or B" includes the following three combinations: only A, only B, and a combination of A and B.

As used herein, depending on the context, the term "if" is optionally construed as "when", "in a case where", "in response to determining" or "in response to detecting". Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

The phase "applicable to" or "configured to" used herein means an open and inclusive expression, which does not exclude devices that are applicable to or configured to perform additional tasks or steps.

In addition, the phrase "based on" used is meant to be open and inclusive, since processes, steps, calculations or other actions "based on" one or more of the stated conditions or values may, in practice, be based on additional conditions or values exceeding those stated.

The term such as "about", "substantially" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

The term such as "perpendicular" or "equal" as used herein includes a stated case and a case similar to the stated case within an acceptable range of deviation determined by a person of ordinary skill in the art, considering measurement in question and errors associated with measurement of a particular quantity (i.e., limitations of a measurement system). For example, the term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of approximate equality may be, for example, that a difference between two equals is less than or equal to 5% of any one of the two equals.

It will be understood that, in a case where a layer or an element is referred to as being on another layer or a substrate, it may be that the layer or the element is directly on the another layer or the substrate, or there may be a middle layer between the layer or the element and the another layer or the substrate.

Exemplary embodiments are described herein with reference to sectional views and/or plan views as idealized exemplary drawings. In the drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

FIG. 1A is a structural diagram of a display apparatus, in accordance with some embodiments.

As shown in FIG. 1A, some embodiments of the present disclosure provide a display apparatus 1. In some examples, the display apparatus 1 may be a product with an image display function.

In some examples, the display apparatus 1 may be any device that displays images whether in motion (e.g., a video) or fixed (e.g., a still image), and regardless of text or image. More specifically, it is expected that the embodiments may be implemented in or associated with various electronic devices. The various electronic devices may include (but is not limit to), for example, mobile telephones, wireless devices, personal data assistants (PDAs), hand-held or portable computers, global positioning system receivers/navigators, cameras, MP4 video players, video cameras, game consoles, watches, clocks, calculators, TV monitors, flat panel displays, computer monitors, car displays (e.g., odometer displays), navigators, cockpit controllers and/or displays, camera view displays (e.g., rear view camera displays in vehicles), electronic photos, electronic billboards or indicators, projectors, building structures, or packagings and aesthetic structures (e.g., a display for an image of a piece of jewelry).

Embodiments of the present disclosure do not further limit the display apparatus 1, and the following will be described by taking an example in which the display apparatus 1 is a product with an image display function.

For example, in a case where the display apparatus 1 is a large-sized display apparatus, the display apparatus 1 includes a plurality of display sub-apparatuses, and the plurality of display sub-apparatuses are tiled together to form a large-sized display apparatus to meet the requirement of large-size display. The display apparatus may be referred to as a tiled display apparatus.

In some examples, the display apparatus 1 may be a liquid crystal display (LCD) apparatus.

Figure 1B:
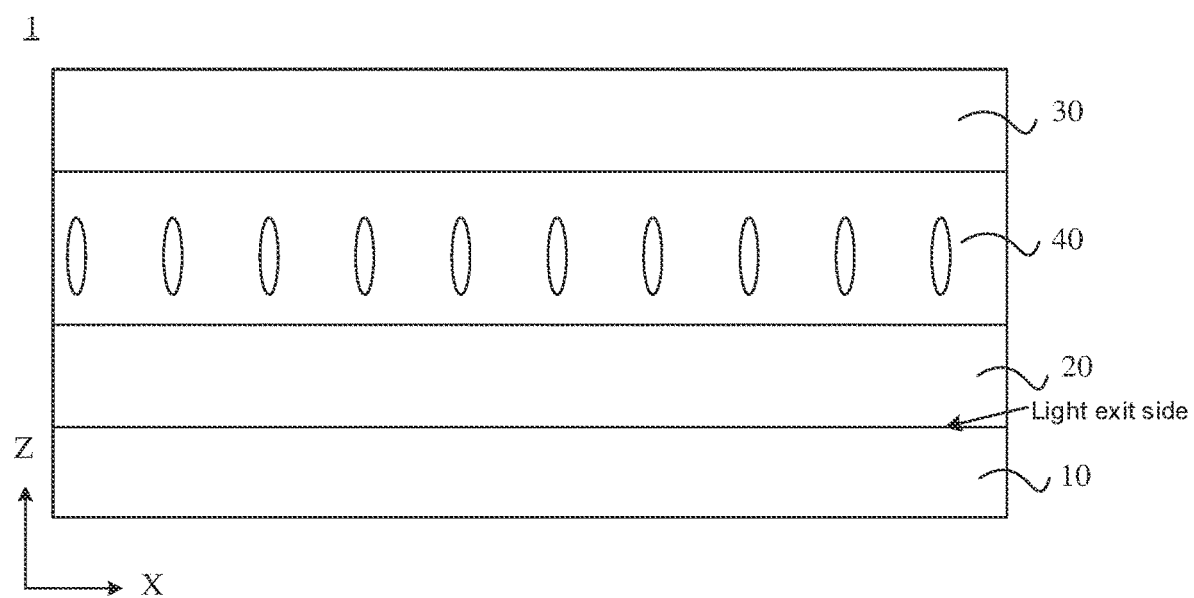
FIG. 1B is a structural diagram of another display apparatus, in accordance with some embodiments of the present disclosure.

In some examples, as shown in FIG. 1B, the display apparatus 1 includes a backlight module 10, an array substrate 20 located on a light exit side of the backlight module 10, and a color filter substrate 30 located on a side of the array substrate 20 away from the backlight module 10.

For example, the backlight module 10 may be used as a light source to provide backlight. For example, the backlight provided by the backlight module 10 may be white light or blue light.

For example, the light exit side of the backlight module 10 refers to a side from which the backlight module 10 emits light.

For example, the array substrate 20 includes a plurality of pixel driving circuits and a plurality of pixel electrodes, and the plurality of pixel driving circuits may be arranged in an array, for example. The plurality of pixel driving circuits are electrically connected to the plurality of pixel electrodes in a one-to-one correspondence, and the pixel driving circuit provides a pixel voltage for the respective pixel electrode.

For example, the display apparatus 1 further includes a common electrode. The common electrode may be disposed in the color filter substrate 30, and the common electrode may receive a common voltage. Alternatively, the common electrode may be disposed in the array substrate 20, which is not limited in the present disclosure.

In some examples, as shown in FIG. 1B, the display apparatus 1 further includes a liquid crystal layer 40 located between the color filter substrate 30 and the array substrate 20.

In some examples, the liquid crystal layer 40 includes a plurality of liquid crystal molecules. For example, an electric field may be created between the pixel electrode and the common electrode. By controlling the voltage value of each pixel, the intensity of the electric field created between the common electrode and each pixel electrode may be controlled, thereby controlling the deflection angle of the liquid crystal molecules in the liquid crystal layer 40.

It will be understood that the backlight provided by the backlight module 10 may pass through the array substrate 20 and be incident on the liquid crystal molecules in the liquid crystal layer 40. Due to the action of the electric field created between the pixel electrode and the common electrode, the liquid crystal molecules flip, thereby changing the amount of light passing through the liquid crystal molecules. Thus, the light emitted through the liquid crystal molecules reaches a preset brightness. The light is emitted after passes through the filters of different colors in the color filter substrate 30. The emitted light includes light of various colors, such as red light, green light, and blue light, and the light of various colors cooperate with each other to enable the display apparatus 1 to display images.

In some examples, in a case where the backlight provided by the backlight module 10 is white light, the color filter substrate 30 may include a red filter film, a green filter film, and a blue filter film. By controlling the intensity of light irradiated to the red filter film, the green filter film and the blue filter film, different intensities of red light, green light and blue light may be obtained, so that the display apparatus 1 is able to display color images. For example, the red filter film may only transmit red light in the incident light, the green filter film may only transmit green light in the incident light, and the blue filter film may only transmit blue light in the incident light.

In some other examples, in a case where the backlight provided by the backlight module 10 is blue light, the color filter substrate 30 may include a color conversion film. For example, the color conversion film may be a quantum dot film. After being irradiated to the red quantum dot film, blue light may be converted into red light. After being irradiated to the green quantum dot film, blue light may be converted into green light. The red light and green light converted by the quantum dot film are mixed with the blue light provided by the backlight module 10, so that the display apparatus 1 may achieve full-color graphics display.

For example, the type of the backlight module 10 in the display apparatus 1 may be varied, which may be set according to actual conditions, and is not limited in the present disclosure.

For example, the backlight module 10 may be an edge-type backlight module, or the backlight module 10 may be a direct-type backlight module.

For convenience of description, the following embodiments of the present disclosure are described by taking an example in which the backlight module 10 is a direct-type backlight module.

Figure 2:
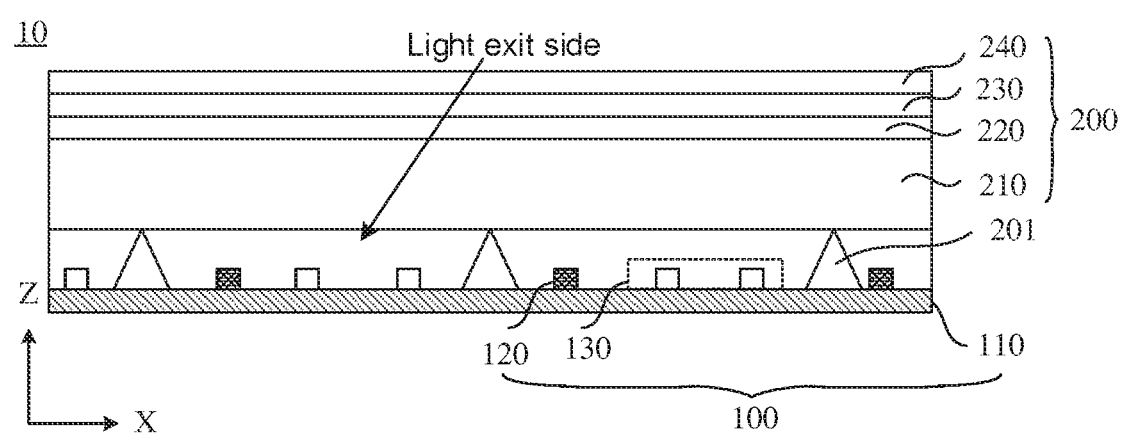
FIG. 2 is a structural diagram of a backlight module, in accordance with some embodiments of the present disclosure.

In some embodiments, as shown in FIG. 2, the backlight module 10 includes a light-emitting substrate 100 and an optical film 200 located on a light exit side of the light-emitting substrate 100.

For example, the optical film 200 includes a diffusion plate 210, a quantum dot film 220, a diffusion sheet 230 and a composite film 240 that are disposed on the light exit side of the light-emitting substrate 100 in sequence.

For example, the diffusion plate 210 and the diffusion sheet 230 are used to eliminate lamp shadows and uniformize the light emitted by the light-emitting substrate 100 to improve the uniformity of the light.

For example, the quantum dot film 220 is used to convert the light emitted by the light-emitting substrate 100. Optionally, in a case where the light emitted by the light-emitting substrate 100 is blue light, the quantum dot film 220 may convert blue light into white light to improve the purity of white light.

For example, the composite film 205 may be used to improve the luminance of the light emitted by the light-emitting substrate 100.

It will be understood that after the light emitted by the light-emitting substrate 100 is incident on the optical film 200, the luminance of the light emitted from the optical film 200 may be improved, and the emitted light has high purity and good uniformity.

The backlight module 10 may include a plurality of light-emitting substrates 100 and optical films corresponding thereto. The plurality of light-emitting substrates 100 may be tiled together, and the corresponding optical films may also be tiled together, so that the backlight module 10 has a large size. In this case, the backlight module 10 may be referred to as a tiled display module, and may be applied to the tiled display apparatus.

In some examples, as shown in FIG. 2, the backlight module 10 further includes supporting pillars 201 disposed between the light-emitting substrate 100 and the diffusion plate 210 of the optical film 200.

For example, the supporting pillars 201 may be fixed on the light-emitting substrate 100 by an adhesive. The supporting pillars 201 may be used to support the optical film 200, so that the light emitted by the light-emitting substrate 100 may obtain a certain light mixing distance to further eliminate lamp shadows and improve the uniformity of light.

In some examples, the display apparatus 1 further includes a frame, a display chip and other electronic components.

In some other examples, the display apparatus 1 includes the light-emitting substrate 100, and the light-emitting substrate 100 is used to directly display images. The display apparatus is generally used in commercial displays, such as traffic management command center display screens or commercial plaza display screens.

Figure 3:
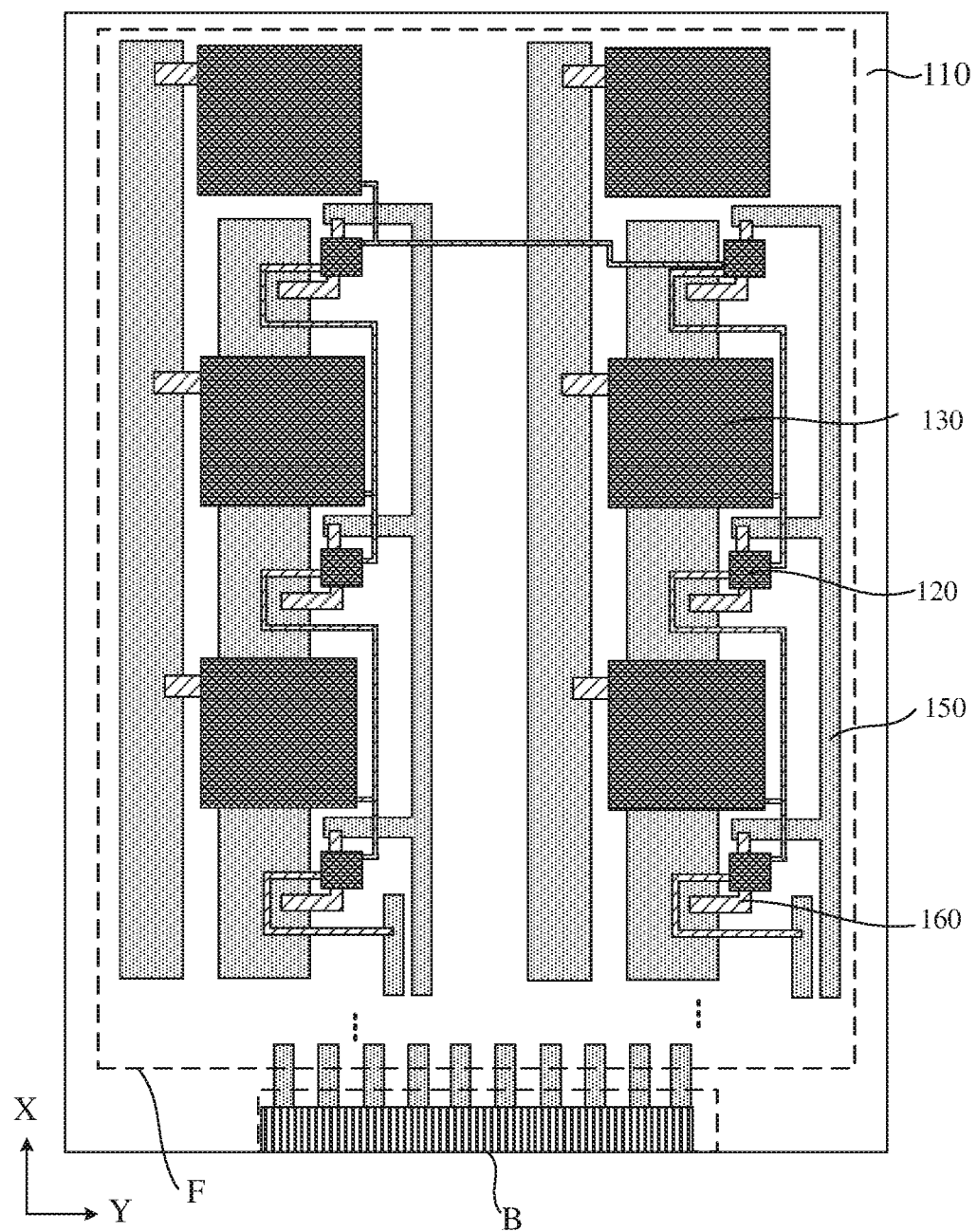
FIG. 3 is a structural diagram of a light-emitting substrate, in accordance with some embodiments of the present disclosure.

In some embodiments, as shown in FIG. 3, the light-emitting substrate 100 has a functional area F and a bonding area B.

In some examples, as shown in FIG. 3, the light-emitting substrate 100 includes a substrate 110 and a plurality of driver chips 120 and light-emitting device groups 130 located on a same side of the substrate 110.

For example, under control of a driving signal transmitted by the driver chip 120, the light-emitting device group 130 may emit light.

Figure 4:
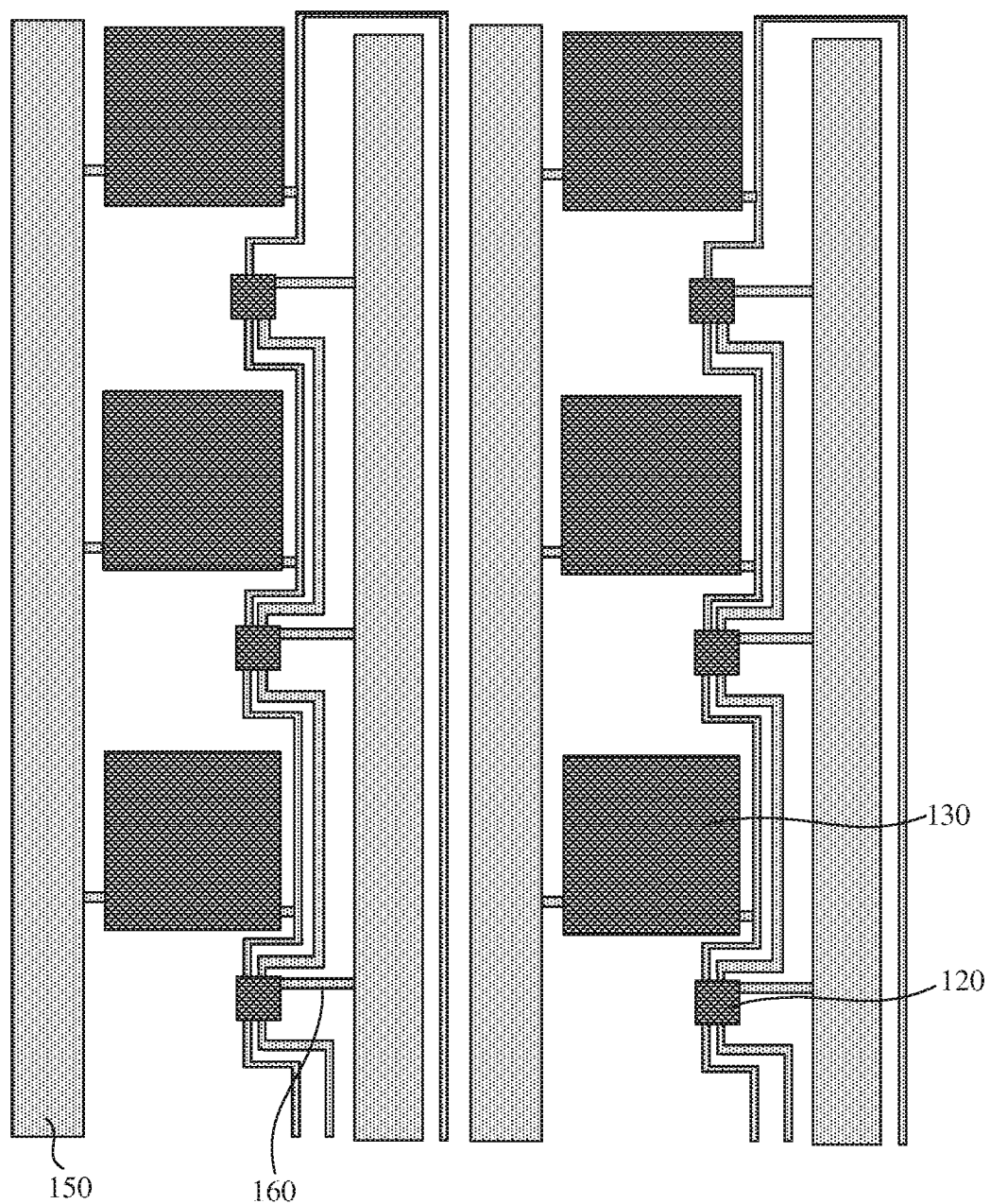
FIG. 4 is a structural diagram of another light-emitting substrate, in accordance with some embodiments of the present disclosure.

It will be understood that, as shown in FIGS. 3 and 4, the light-emitting substrate 100 further includes a plurality of signal lines 150 and connection lines 160 that are located between the substrate 110 and the plurality of driver chips 120. For example, the plurality of signal lines 150 include a plurality of first voltage signal lines, a plurality of second voltage signal lines, a plurality of data signal lines, a plurality of address signal lines and a plurality of ground signal lines. The first voltage signal line may be referred to as a device power signal line, which is used to provide a large constant voltage for the light-emitting device group 130, and then form a loop with the ground signal line; the second voltage signal line may be referred to as a chip power signal line, which is used to input a voltage signal that provides working power for the driver chip 120.

The multiple connection lines 160 are used to achieve the electrical connection between the driver chips 120 and the signal lines 150, the electrical connection between the light-emitting device groups 130 and the signal lines 150, and the electrical connection between the light-emitting device groups 130 and the driver chips 120.

In some examples, as shown in FIG. 3, the plurality of signal lines 150 are dispose in a different conductive layer from the plurality of connection lines 160. For example, the signal lines 150 and the connection lines 160 may be respectively disposed in two conductive layers, and the material of the conductive layer may include a metal material, such as copper. In this case, the light-emitting substrate 100 is generally referred to as a light-emitting substrate with double-layer wiring.

In some other examples, as shown in FIG. 4, the plurality of signal lines 150 and the plurality of connection lines 160 are disposed in a same conductive layer, and the material of the conductive layer may include a metal material, such as copper. In this case, the light-emitting substrate 100 is generally referred to as a light-emitting substrate with single-layer wiring.

Generally, in a process of manufacturing the light-emitting substrate 100 with double-layer wiring, a plurality of insulating layers are provided between two conductive layers, and a plurality of insulating layers are provided between a conductive layer proximate to the driver chips 120 and the driver chips 120. For example, two insulating layers are provided between the conductive layer proximate to the driver chips 120 and the driver chips 120. The two insulating layers include an inorganic insulating layer and an organic insulating layer sequentially stacked in a direction away from the substrate 110. The material of the inorganic insulating layer is, for example, silicon nitride or silicon oxide, and the inorganic insulating layer is used to isolate the conductive layer from moisture and oxygen. The material of the organic insulating layer may be, for example, an over coating (OC) adhesive, and the organic insulating layer is used to protect the conductive layer proximate to the driver chip 120 among the two conductive layers, so that the conductive layer is not easily oxidized and the corrosion rate of the conductive layer is delayed. In the process of manufacturing the light-emitting substrate 100 with single-layer wiring, only one insulating layer is generally disposed between the conductive layer and the driver chips 120. A material of the insulating layer may be, for example, silicon nitride, or silicon oxide.

It will be understood that during the usage of the light-emitting substrate 100, it is inevitable that the light-emitting substrate 100 will be in contact with the human body. After the human body is charged with a certain amount of static electricity due to friction and other reasons, when the human body comes into contact with the light-emitting substrate 100, the static electricity will be transferred to the light-emitting substrate 100 and discharged through the light-emitting substrate 100. The equivalent resistance of the human body is in the order of KΩ (e.g., 1500Ω). After the human body is in contact with the light-emitting substrate 100, the electrostatic discharge performed in the light-emitting substrate 100 is characterized by long discharge time, small peak current, the ability to generate extremely high instantaneous discharge current in a few hundred nanoseconds, and the discharge current reaching several amperes.

In addition, the manufacturing process of the light-emitting substrate 100 generally includes an assembly or transportation process of the light-emitting substrate 100. For example, during the coating process of the light-emitting substrate 100, the light-emitting substrate 100 will come into contact with other charged conductors, and then the static electricity on the charged conductors will be transmitted to the light-emitting substrate 100, thereby causing charging and discharging phenomena. The current generated during the manufacturing process may reach up to approximatively 21 A; the large current rapidly discharges and the pulse discharges in the light-emitting substrate, which easily cause damage to the internal circuits of the light-emitting substrate 100.

Figure 5:
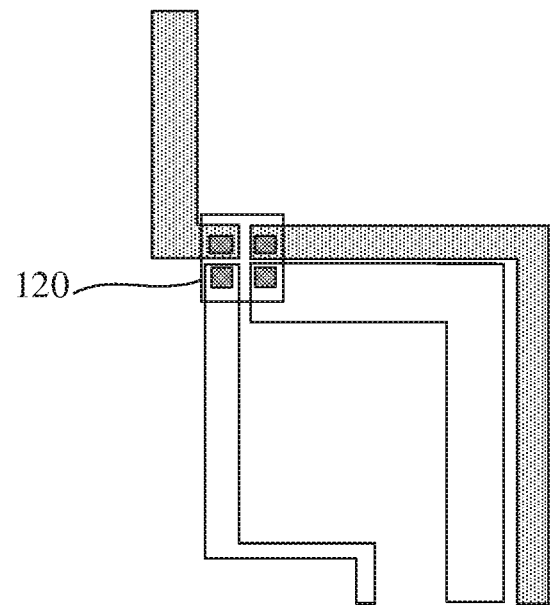
FIG. 5 is a partial enlarged view of yet another light-emitting substrate, in accordance with some examples.

In some examples, in a case where there is one light-emitting device group 130 electrically connected to the driver chip 120 in the light-emitting substrate 100 with single-layer wiring, the driver chip 120 has four pins, and the four pins are respectively connected to the signal line (i.e., the first voltage signal line, the ground signal line) in the lamp area, the ground signal, the working signal line and the address signal line; the working signal line may provide the power signal (i.e., the second voltage signal provided by the second voltage signal line) and a data signal for the driver chip 120. That is, all the four pins of the driver chip 120 are each connected to a signal line, as shown in FIG. 5.

Figure 6:
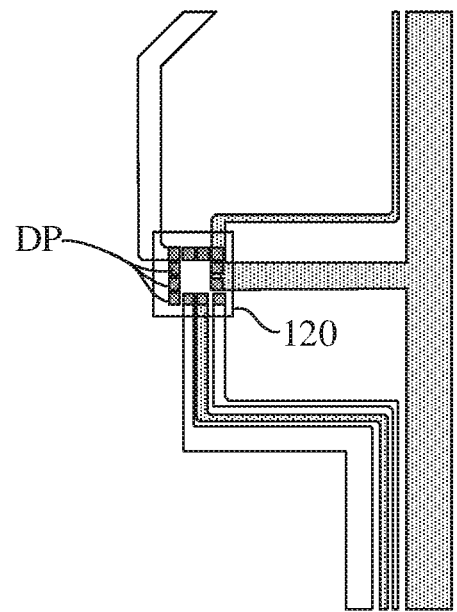
FIG. 6 is a partial enlarged view of yet another light-emitting substrate, in accordance with some embodiments of the present disclosure.

However, there are a plurality of light-emitting device groups 130 electrically connected to the driver chip 120, on a sky side of the light-emitting substrate 100 (the sky side of the light-emitting substrate 100 referring to a side of the functional area F away from the bonding area B) and/or a ground side of the light-emitting substrate 100 (the ground side of the light-emitting substrate 100 referring to a side of the functional area F proximate to the bonding area B), there is at least one dummy pin (DP), due to the uneven distribution of the light-emitting device groups 130, in the driver chip 120 that is proximate to the sky side of the light-emitting substrate 100 and/or proximate to the ground side of the light-emitting substrate 100. That is, at least one pin of the driver chip 120 that is proximate to the sky side of the light-emitting substrate 100 and/or proximate to the ground side of the light-emitting substrate 100 is in a floating state. For example, as shown in FIG. 6, FIG. 6 is a partial enlarged view of a light-emitting substrate provided by some embodiments of the present disclosure, the driver chip 120 has a plurality of dummy pins DP.

Further, the inventors of the present disclosure have found through researches that, during the die bonding process of the driver chip 120, a reflow soldering process is usually used, compared with other pins connected to signal lines, the pins in the floating state have a different stress environment (for example, compared with other pins connected to signal lines, the pins in the floating state have smaller stress bearing area during reflow soldering), resulting in uneven stress on the driver chip 120 during reflow soldering, thereby affecting the flatness of the welding of the driver chip 120; moreover, since the number of protective layers (i.e., the above insulating layers) of the light-emitting substrate 100 with single-layer wiring is less than that of the protective layers (i.e., the above insulating layers) of the light-emitting substrate 100 with double-layer wiring, the protective layer of the light-emitting substrate 100 with single-layer wiring has a small thickness (the thickness of the protective layer is generally in a range of 1200 A to 4000 A), resulting in that the anti-electro static discharge (ESD) capability of the light-emitting substrate 100 with single-layer wiring is lower than the anti-ESD capability of the light-emitting substrate 100 with double-layer wiring. On this basis, since multiple pins of the driver chip 120 need to transmit multiple signals simultaneously, i.e., multiple signals gather in the driver chip 120, the pins in the floating state will aggravate the ESD risk at the driver chip 120, causing the circuits in the driver chip 120 to be damaged or the driver chip 120 to be burned.

Figure 7:
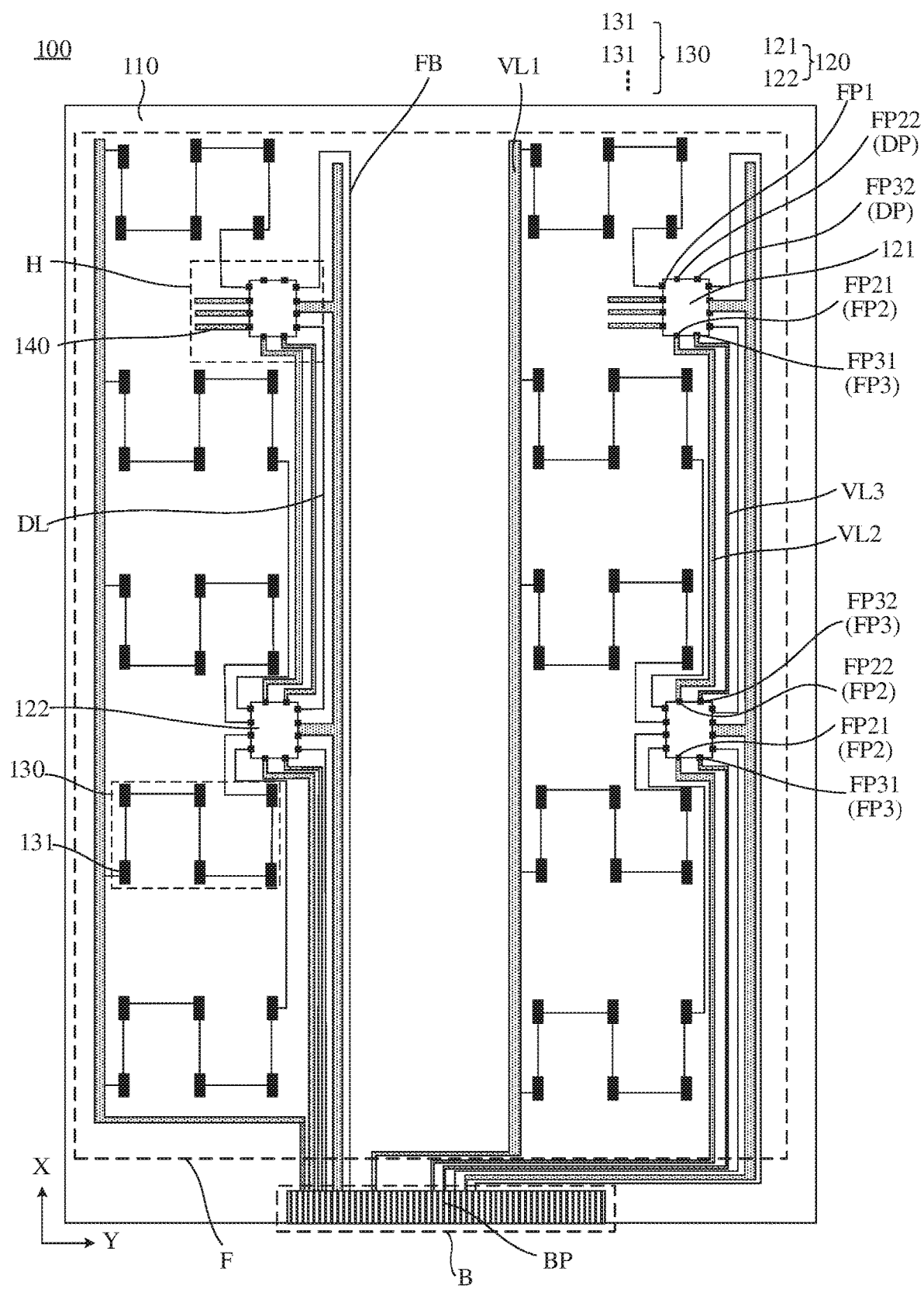
FIG. 7 is a structural diagram of yet another light-emitting substrate, in accordance with some embodiments of the present disclosure.

In light of this, some embodiments of the present disclosure provide a light-emitting substrate 100. As shown in FIG. 7, the light-emitting substrate 100 has a functional area F and a bonding area B.

The bonding area B and the functional area F are arranged in sequence in a first direction X. It will be noted that, considering FIG. 7 in the accompanying drawings of the embodiments of the present disclosure as an example, the edge of the functional area F and the edge of the bonding area B shown in the dotted boxes are spaced apart from each other only to clearly distinguish the functional area F and the bonding area B without limiting the positions of the edges of functional area F and the bonding area B.

For example, the bonding area B is an area where the light-emitting substrate 100 and the display chip are bonded.

For example, the shape of the functional area F varies, and may be selected according to the actual situation, and is not limited in the present disclosure. For example, the shape of the functional area F may be rectangular, circular, or the like.

For convenience of illustration, the following is described by taking an example in which the shape of the functional area F is rectangular.

In some examples, the light-emitting substrate 100 includes a substrate 110, a plurality of driver chips 120, and a plurality of conductive patterns 140.

In some examples, the substrate 110 may be a flexible substrate. The flexible substrate may be, for example, a polyethylene terephthalate (PET) substrate, a polyethylene naphthalate two formic acid glycol ester (PEN) substrate or a polyimide (PI) substrate.

In some other examples, the substrate 110 may be a rigid substrate. The rigid substrate may be, for example, a glass substrate or a polymethyl methacrylate (PMMA) substrate.

In some examples, the driver chips 120 are located on the substrate 110. Each driver chip 120 is used to be connected to at least one light-emitting device group 130, and a plurality of light-emitting device groups 130 electrically connected to the driver chip 120 are adjacent in a column direction. The plurality of light-emitting device groups 130 are arranged in rows in the first direction X and in columns in a second direction Y. The plurality of driver chips 120 are arranged in rows in the first direction X and in columns in the second direction Y. Further, the driver chip 120 connected to multiple light-emitting device groups 130 may be located in a region between two adjacent light-emitting device groups 130 in the multiple light-emitting device groups 130.

For example, the plurality of light-emitting device groups 130 are arranged in M rows in the first direction, that is, a column of light-emitting device groups 130 includes M light-emitting device groups 130; the plurality of driver chips 120 are arranged in N rows in the first direction, that is, a column of driver chips 120 includes N driver chips 120. In a case where M may be divisible by N, the number of light-emitting device groups 130 connected to each driver chip 120 located in the same column may be the same; in a case where M may not be divisible by N, the driver chips 120 in a same column include at least one first driver chip 121 and a plurality of second driver chips 122; the number of light-emitting device groups 130 connected to the first driver chip 121 is less than the number of light-emitting device groups 130 connected to the second driver chip 122. In this case, the first driver chip 121 has a dummy pin DP.

For example, among the plurality of first driver chips 121, at least one first driver chip 121 is closer to the bonding area B than the plurality of second driver chips 122 (i.e., at least one first driver chip 121 is located on a side of the plurality of second driver chips 122 proximate to the bonding area B); that is, at least one first driver chip 121 is closer to the ground side of the light-emitting substrate 100 than the plurality of second driver chips 122. For another example, among the plurality of first driver chips 121, at least one first driver chip 121 is further away from the bonding area B than the plurality of second driver chips 122 (i.e., at least one first driver chip 121 is located on a side of the plurality of second driver chips 122 away from the bonding area B); that is, at least one first driver chip 121 is closer to the sky side of the light-emitting substrate 100 than the plurality of second driver chips 122. For another example, among the plurality of first driver chips 121, at least one first driver chip 121 is closer to the bonding area B than the plurality of second driver chips 122, and another at least one first driver chip 121 is further away from the bonding area B than the plurality of second driver chips 122. The first driver chip 121 includes at least one dummy pin DP.

For example, the plurality of first driver chips 121 and the plurality of second driver chips 122 are located in the functional area F. It will be understood that the plurality of rows driver chips 120 (including the plurality of first driver chips 121 and the plurality of second driver chips 122) are spaced apart in the first direction X, and the plurality of columns driver chips 120 are spaced apart in the second direction Y.

It will be noted that in the accompanying drawings of the embodiments of the present disclosure, only three rows and two columns of driver chips 120 are shown (as shown in FIG. 7) to clearly illustrate the structure of the light-emitting substrate 100, without further limiting the number and arrangement of the driver chips 120 in the embodiments of the present disclosure.

For example, the first direction X intersects with the second direction Y.

An included angle between the first direction X and the second direction Y may be set according to actual needs. For example, the included angle between the first direction X and the second direction Y is 85°, 88°, 90°, or the like.

It will be understood that both the first driver chip 121 and the second driver chip 122 have a plurality of pins.

Furthermore, the number of pins of the first driver chip 121 and the number of pins of the second driver chip 122 may or may not be equal, and the embodiments of the present disclosure do not limit thereto. For example, as shown in FIG. 7, the number of pins of the first driver chip 121 is equal to the number of pins of the second driver chip 122.

For example, FIG. 7 illustrates that both the first driver chip 121 and the second driver chip 122 have 12 pins.

It will be understood that some pins are connected to some above-mentioned signal lines (e.g., the second voltage signal line, and the ground signal line) through the above-mentioned connection lines, thereby achieving that the first driver chip 121 or the second driver chip 122 is electrically connected to the some signal lines; some pins are connected to the light-emitting device groups 130 through the above-mentioned connection lines, thereby achieving that the first driver chip 121 or the second driver chip 122 is electrically connected to the light-emitting device groups 130.

In some examples, the first driver chip 121 includes one dummy pin DP.

In some other examples, the first driver chip 121 includes a plurality of dummy pins DP.

In some examples, a plurality of conductive patterns 140 are located between the substrate and the plurality of driver chips 120, and a conductive pattern 140 is electrically connected to a dummy pin DP.

For example, the plurality of conductive patterns 140 may be made of a metal material, such as copper.

For example, the plurality of conductive patterns 140 and the above-mentioned signal lines and connection lines are disposed in a same conductive layer. For another example, the plurality of conductive patterns 140 and the above-mentioned signal lines and connection lines are disposed in different conductive layers.

For example, the plurality of conductive patterns 140 are located in the functional area F. In a case where the first driver chip 121 includes a plurality of dummy pins DP, the plurality of conductive patterns 140 electrically connected to the plurality of dummy pins DP may be arranged in a column.

Optionally, in the case where the first driver chip 121 includes a plurality of dummy pins DP, each of the dummy pins DP may be connected to the conductive pattern 140, or some of the dummy pins DP may be connected to the conductive pattern 140, the embodiments of the present disclosure do not limit thereto.

With the above arrangement, each pin of the first driver chip 121 is connected to an electrical pattern, thereby improving the evenness of the stress of each pin of the first driver chip 121 and ameliorating the problem of poor soldering of the first driver chip 121 during the reflow soldering process caused by the uneven stress of the pins of the first driver chip 121; moreover, the static electricity on the light-emitting substrate 100 may be transmitted, through the dummy pin DP, to the conductive pattern 140 electrically connected to the dummy pin DP, and may be transmitted, through the conductive pattern 140, to a side of the conductive pattern 140 away from the first driver chip 121 to prevent the static electricity on the light-emitting substrate 100 from accumulating at the dummy pin DP of the first driver chip 121, thereby reducing the damage of the static electricity to the first driver chip 121, improving the anti-ESD performance of the first driver chip 121, and ameliorating the defects of circuit damages or overburning of the first driver chip 121 caused by static electricity due to the presence of pins in the floating state. Thus, the dependability and reliability of the product of the light-emitting substrate 100 are improved.

Figure 8:
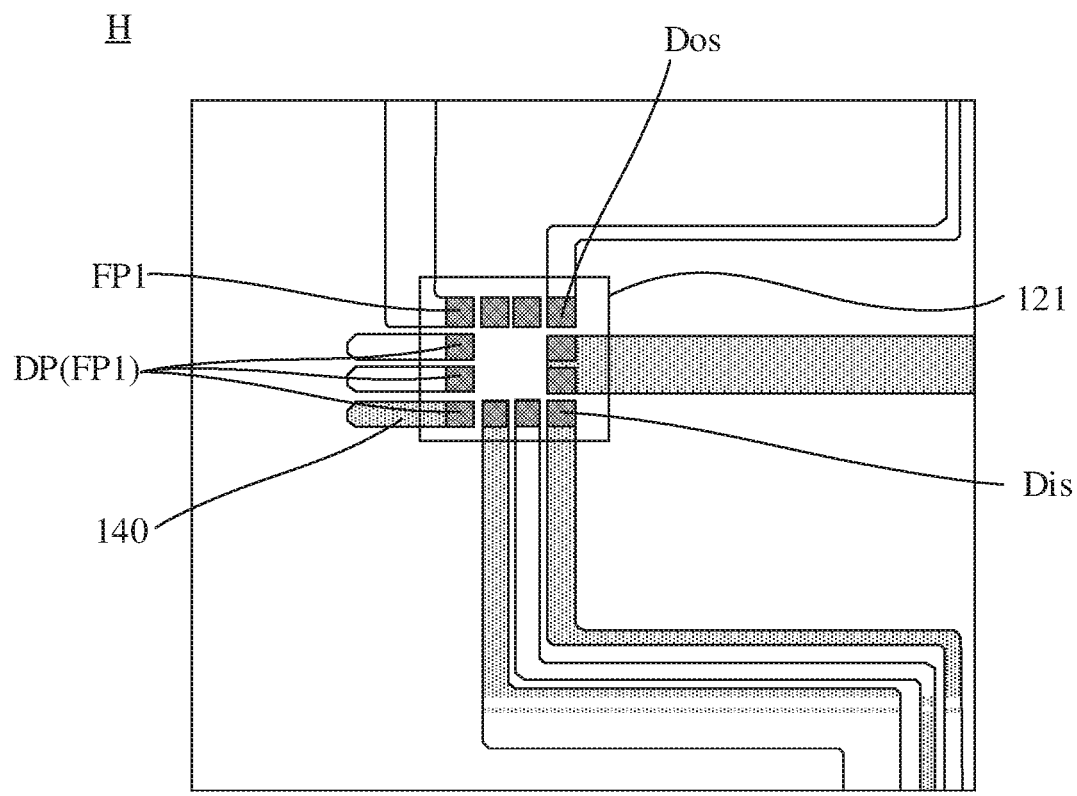
FIG. 8 is an partial enlarged view of the H region in FIG. 7.

In some embodiments, as shown in FIGS. 7 and 8, the light-emitting substrate 100 further includes a plurality of light-emitting device groups 130 located on the substrate 110; the first driver chip 121 includes a plurality of channel pins FP1, and a channel pin FP1 is configured to be electrically connected to a light-emitting device group 130. Among the plurality of channel pins FP1 of the first driver chip 121, a part of the channel pins FP1 serves as a dummy pin DP and is connected to no light-emitting device group 130.

For example, the number of channel pins FP1 included in the first driver chip 121 may be two or more.

For example, in a case where the number of channel pins FP1 included in the first driver chip 121 is more than two, a channel pin FP1 may serve as a dummy pin DP, or multiple channel pins FP1 may serve as dummy pins DP.

For example, FIG. 8 illustrates that the first driver chip 121 includes four channel pins FP1. Three channel pins FP1 serve as dummy pins DP and are not connected to the light-emitting device groups 130. Furthermore, the three channel pins FP1 that serve as the dummy pins DP are each connected to a conductive pattern 140.

For example, the second driver chip 122 includes a plurality of channel pins FP1. The number of channel pins FP1 included in the first driver chip 121 and the number of channel pins FP1 included in the second driver chip 122 may be the same or different, and embodiments of the present disclosure do not limit thereto.

For example, the number of light-emitting device groups 130 electrically connected to the first driver chip 121 may be one or more. The number of light-emitting device groups electrically connected to the second driver chip 122 is multiple.

For example, the plurality of light-emitting device groups 130 are arranged in rows in the first direction X and in columns in the second direction Y. It will be understood that the multiple rows of light-emitting device groups 130 are spaced apart in the first direction X, and the multiple columns of driver chips 120 are spaced apart in the second direction Y.

For example, the light-emitting device group 130 includes at least two light-emitting devices 131.

For example, the light-emitting device group 130 may include two light-emitting devices 131, four light-emitting devices 131, or six light-emitting devices 131.

Optionally, the light-emitting devices 131 in a light-emitting device group 130 may be arranged at the vertices of a hexagon, an octagon, or other irregular shapes. Alternatively, the light-emitting devices 131 in a light-emitting device group 130 may be arranged in a shape of a circle or ellipse to meet different usage requirements, and the embodiments of the present disclosure are not limited thereto.

For example, the light-emitting devices 131 included in a light-emitting device group 130 may be used to emit light of a same color, and the light-emitting devices 131 included in a same light-emitting device group 130 may be used to emit light of different colors.

It will be understood that, the number of the light-emitting devices 131 included in different light-emitting device groups 130 may be the same or different. The number of the light-emitting devices 131 in a light-emitting device group 130 is not limited in the embodiments of the present disclosure.

For example, at least two light-emitting devices 131 in the same light-emitting device group 130 are connected to each other in series. In this way, by providing an electrical signal to any light-emitting device 131 in a light-emitting device group 130, it is possible to provide the electrical signal to each of the light-emitting devices 131 in the light-emitting device group 130, thereby improving the wiring convenience of the light-emitting substrate 100.

For example, under control of a driving signal transmitted by the driver chip 120, the light-emitting device group 130 may emit light.

For example, the light-emitting device 131 may be a mini LED. Since the grain size of the mini LED is small, it is possible to greatly shorten the light mixing distance between adjacent mini LEDs. Thus, the light-emitting substrate have the advantages of adjustable regional brightness, high color rendering, and high contrast, and the light-emitting substrate 100 is thin and light, and saves electricity, so that the application of the light-emitting substrate including mini LEDs is more flexible. In addition, compared with organic light-emitting diodes (OLEDs), the light-emitting substrate including mini LEDs has lower costs, longer lifespan, and less risk of screen burn-in.

In these embodiments, among the plurality of channel pins FP1 of the first driver chip 121, a part of the channel pins FP1 serves as the dummy pin DP and is in the floating state. In this case, by electrically connecting the channel pin FP1 that is in the floating state to the conductive pattern 140, the static electricity on the light-emitting substrate 100 may be transmitted to the conductive pattern 140 electrically connected to the channel pin FP1 in the floating state through the channel pin FP1 that is in the floating state, and then transmitted to the side of the conductive pattern 140 away from the first driver chip 121 through the conductive pattern 140 to prevent the static electricity on the light-emitting substrate 100 from accumulating at the channel pin FP1 that is in the floating state, thereby reducing the damage of the static electricity to the first driver chip 121, improving the anti-ESD performance of the light-emitting substrate 100, and improving the dependability and reliability of the product of the light-emitting substrate 100.

In some embodiments, the number of channel pins FP1 included in the second driver chip 122 is the same as the number of channel pins FP1 included in the first driver chip 121; the number of light-emitting device groups 130 connected to the second driver chip 122 is greater than the number of light-emitting device groups 130 connected to the first driver chip 121.

For example, as shown in FIGS. 7 and 8, both the first driver chip 121 and the second driver chip 122 have four channel pins FP1. The number of the light-emitting device groups 130 connected to the second driver chip 122 is four, and the number of the light-emitting device groups 130 connected to the first driver chip 121 is one. In this case, among the four channel pins FP1 included in the first driver chip 121, the three channel pins FP1 that are not connected to the light-emitting device groups 130 serve as dummy pins DP. That is, the first driver chip 121 includes three dummy pins DP.

Further, as shown in FIG. 8, the three dummy pins DP are each connected to the conductive pattern 140.

It will be understood that the number of the light-emitting device groups 130 connected to the first driver chip 121 mainly depends on the distribution of the light-emitting device groups 130. Based on the different distribution of the light-emitting device groups 130, in a case where the number of the light-emitting device groups 130 connected to the second driver chip 122 is four, the number of the light-emitting device groups 130 connected to the first driver chip 121 may also be two or three, and the embodiments of the present disclosure do not limit thereto.

In these embodiments, based on the distribution of the light-emitting device groups 130, the number of the light-emitting device groups 130 connected to the first driver chip 121 proximate to the sky side or the ground side is less than the number of light-emitting devices connected to the second driver chip 122. By electrically connecting the channel pin FP1 that is not electrically connected to the light-emitting device group 130 to the conductive pattern 140, the static electricity on the light-emitting substrate 100 may be transmitted to the conductive pattern 140 electrically connected to the channel pin FP1 through the channel pin FP1 that is not electrically connected to the light-emitting device group 130, and then transmitted to the side of the conductive pattern 140 away from the driver chip 120 through the conductive pattern 140 to prevent the static electricity on the light-emitting substrate 100 from accumulating at the first driver chip 121, thereby reducing the damage of the static electricity to the first driver chip 121, improving the anti-ESD performance of the light-emitting substrate 100, and improving the dependability and reliability of the product of the light-emitting substrate 100.

Figure 9:
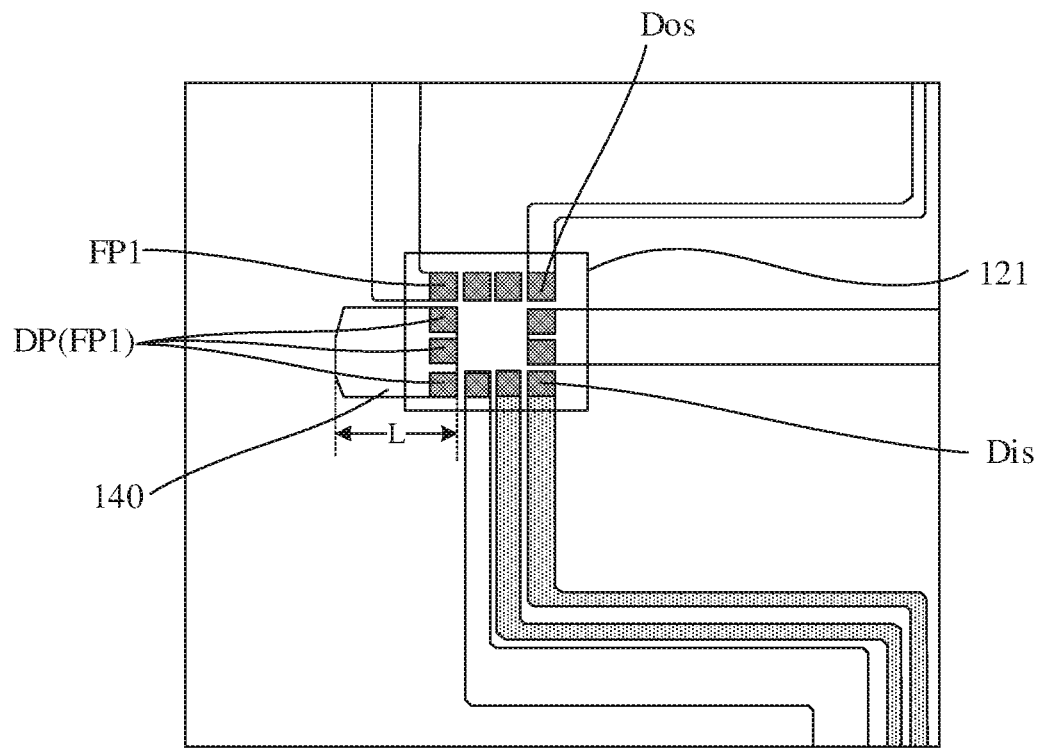
FIG. 9 is a partial enlarged view of yet another light-emitting substrate, in accordance with some embodiments of the present disclosure.

In some embodiments, as shown in FIG. 9, the first driver chip 121 includes a plurality of dummy pins DP, and conductive patterns 140 connected to at least two dummy pins DP of the first driver chip 121 are of a one-piece structure.

In some examples, in a case where the first driver chip 121 includes a plurality of dummy pins DP, conductive patterns 140 connected to the plurality of dummy pins DP of the first driver chip 121 are of a one-piece structure. For example, as shown in FIG. 9, the first driver chip 121 includes 4 channel pins FP1, in which three channel pins FP1 serve as dummy pins DP, and conductive patterns 140 connected to the three channel pins FP1 that are in the floating state are of a one-piece structure.

In some other examples, in a case where the first driver chip 121 includes a plurality of dummy pins DP, conductive patterns 140 connected to some of the plurality of dummy pins DP of the first driver chip 121 are of a one-piece structure.

The term "one-piece structure" means that two connected patterns are arranged in the same layer, and the two patterns are continuous and not separated. With such arrangement, the conductive patterns 140 connected to the at least two dummy pins DP may be formed through a single patterning process, thereby simplifying the manufacturing process of the light-emitting substrate 100 and reducing the manufacturing cost of the light-emitting substrate 100.

In some embodiments, as shown in FIG. 7, the light-emitting substrate 100 further includes a plurality of first voltage signal lines VL1 located between the substrate 110 and the plurality of driver chips 120; the light-emitting device group 130 is further connected to the first voltage signal line VL1, and the conductive pattern 140 is not connected to the first voltage signal line VL1.

It will be understood that the first voltage signal line VL1 here is equivalent to the first voltage signal line included in the signal lines 150 in some of the above embodiments.

For example, the plurality of first voltage signal lines VL1 extend in the first direction X and are arranged at intervals in the second direction Y.

It will be understood that the light-emitting substrate 100 further includes a flexible printed circuit (FPC) and a printed circuit board (PCB). Moreover, the bonding area B of the light-emitting substrate 100 are provided with a plurality of bonding pins therein, an end of the flexible circuit board is bonded to the bonding pins in the bonding area B, and the other end is bonded to the printed circuit board.

For example, the first voltage signal line VL1 is located at least in the functional area F, a first voltage signal line VL1 is electrically connected to a column of light-emitting device groups 130, and the first voltage signal line VL1 extends to the bonding area B, so that the signal from the printed circuit board is transmitted to the light-emitting device groups 130. Thus, the power supply outside the light-emitting substrate 100 is electrically connected to the first voltage signal line VL1 through the printed circuit board and the bonding pins, so that the power supply may supply the light-emitting devices 131 in the light-emitting device groups 130 through the first voltage signal line VL1 to enable the light-emitting devices 131 to emit light.

For example, the first voltage signal line VL1 is used to provide a large constant voltage for the light-emitting devices 131 in the light-emitting device groups 130. In a case where the light-emitting device group 130 includes a plurality of light-emitting devices 131, and the plurality of light-emitting devices 131 are connected to each other in series, the first light-emitting device 131 among the plurality of light-emitting devices 131 connected in series is electrically connected to the first voltage signal line VL1, the last light-emitting device 131 among the plurality of light-emitting devices 131 connected in series is electrically connected to the channel pin FP1 of the driver chip 120.

For example, an orthographic projection of the conductive pattern 140 on the substrate 110 is non-overlapping with an orthographic projection of the first voltage signal line VL1 on the substrate 110. That is, there is a gap between the conductive pattern 140 and the first voltage signal line VL1.

With such the arrangement, it is possible to avoid interference or influence on the voltage signal transmitted by the first voltage signal line VL1 when the static electricity on the light-emitting substrate 100 is transmitted to an end of the conductive pattern 140 away from the driver chip 120 through the conductive pattern 140.

In some embodiments, the plurality of conductive patterns 140 and the plurality of first voltage signal lines VL1 are made of a same material and are arranged in a same layer.

For example, both a material of the plurality of conductive patterns 140 and a material of the first voltage signal lines VL1 may be a metal material, such as copper.

The term "same layer" refers to a layer structure that is formed by forming a film layer for forming a specific pattern by a same film-forming process, and then patterning the film layer through a single patterning process by using a same mask. Depending on different specific patterns, the single patterning process may include several exposure, development or etching processes, and the specific patterns in the formed layer structure may be continuous or discontinuous, and these specific patterns may also be at different heights or have different thicknesses.

With such the arrangement, the plurality of conductive patterns 140 and the plurality of first voltage signal lines VL1 are arranged in the same layer, which may reduce the steps of patterning the conductive layer, thereby simplifying the manufacturing process of the light-emitting substrate 100, and reducing the number of masks. Thus, it is possible to simplify the preparation flow of the light-emitting substrate 100, reduce the cost of the light-emitting substrate 100, reduce the occurrence of short circuits and other defects in the light-emitting substrate 100, and improve the yield of the light-emitting substrate 100.

In some embodiments, a minimum distance between the conductive pattern 140 and the first voltage signal line VL1 is greater than or equal to 200 μm. For example, the minimum distance between the conductive pattern 140 and the first voltage signal line VL1 may be 200 μm, 210 μm, 220 μm, 230 μm, or 240 μm, and the embodiments of the present disclosure do not limited thereto.

The conductive pattern 140 has a first end and a second end that are arranged in the second direction Y. The first end of the conductive pattern 140 is electrically connected to the first driver chip.

For example, the first voltage signal line VL1 is located on a side of the conductive pattern away from the first driver chip 121. In this case, the minimum distance between the conductive pattern 140 and the first voltage signal line VL1 is a minimum distance between the second end of the conductive pattern 140 and the first voltage signal line VL1.

With such the arrangement, it is possible to avoid the distance between the conductive pattern 140 connected to the floating pin DP and the adjacent first voltage signal line being too small to avoid interference or influence on the voltage signal transmitted by the adjacent first voltage signal line VL1 when the static electricity on the light-emitting substrate 100 is transmitted to an end of the conductive pattern 140 away from the first driver chip 121 through the conductive pattern 140, thereby avoiding the impact on the light-emitting devices 131 in the light-emitting device group 130, and improving the yield of the light-emitting substrate 100.

Figure 10:
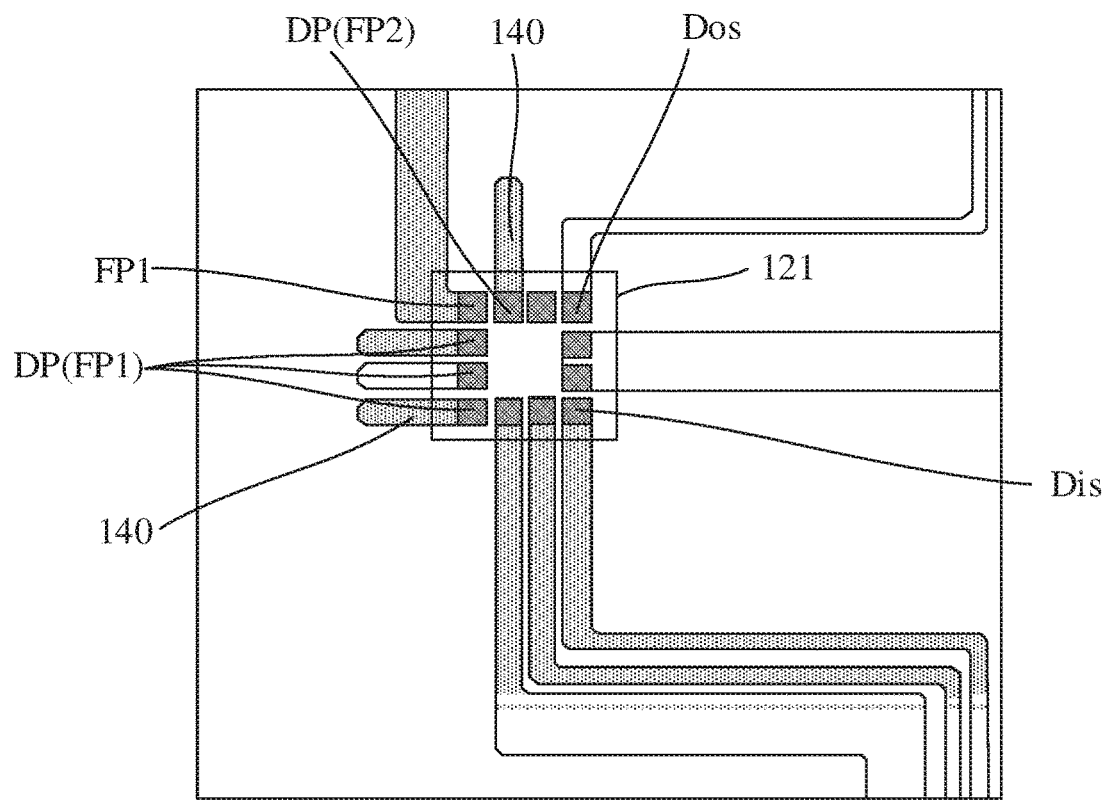
FIG. 10 is a partial enlarged view of yet another light-emitting substrate, in accordance with some embodiments of the present disclosure.

In some embodiments, as shown in FIG. 10, the first driver chip 121 includes a plurality of power supply voltage signal pins FP2; the power supply voltage signal pin FP2 is configured to receive the power supply voltage signal; among the plurality of power supply voltage signal pins FP2 of the first driver chip 121, a part of the power supply voltage signal pins FP2 serves as a dummy pin DP and receives no power supply voltage signal.

For example, the power supply voltage signal received by the power supply voltage signal pin FP2 may be a constant voltage signal, and the power supply voltage signal is used to power the first driver chip 121.

For example, the second driver chip 122 also includes a plurality of power supply voltage signal pins FP2. The number of power supply voltage signal pins FP2 included in the first driver chip 121 and the number of power supply voltage signal pins FP2 included in the second driver chip 122 may be the same or different, and embodiments of the present disclosure do not limit thereto.

For example, the number of power supply voltage signal pins FP2 included in the first driver chip 121 is the same as the number of power supply voltage signal pins FP2 included in the second driver chip 122. Both the first driver chip 121 and the second driver chip 122 have two power supply voltage signal pins FP2. Among the two power supply voltage signal pins FP2 included in the first driver chip 121, one power supply voltage signal pin FP2 serves as a dummy pin DP. Furthermore, the power supply voltage signal pin FP2 that serves as the dummy pin DP is electrically connected to the conductive pattern 140.

With such the arrangement, the power supply voltage signal pin FP2 that serves as the dummy pin DP is electrically connected to the conductive pattern 140, so that the static electricity on the light-emitting substrate 100 may be transmitted to the conductive pattern 140 electrically connected to the power supply voltage signal pin FP2 through the power supply voltage signal pin FP2, and then transmitted to the end of the conductive pattern 140 away from the driver chip 120 through the conductive pattern 140, so as to reduce the damage of the static electricity to the first driver chip 121. Thus, the anti-ESD performance of the light-emitting substrate 100 may be improved, and the dependability and reliability of the product of the light-emitting substrate 100 are improved.

In some embodiments, as shown in FIG. 7, the light-emitting substrate 100 further includes a plurality of second voltage signal lines VL2 located between the substrate 110 and the plurality of driver chips 120; a power supply voltage signal pin FP2 is electrically connected to a second voltage signal line VL2; the conductive pattern 140 is not electrically connected to the second voltage signal line VL2.

It will be understood that the second voltage signal line VL2 described here is equivalent to the second voltage signal line included in the signal lines 150 in some of the above embodiments.

For example, the plurality of second voltage signal lines VL2 extend in the first direction X and are arranged at intervals in the second direction Y.

For example, the second voltage signal line VL2 is located at least in the functional area F; a second voltage signal line VL2 is electrically connected to a column of driver chips 120, and the second voltage signal line VL2 extends to the bonding area B.

For example, an end of the second voltage signal line VL2 is electrically connected to the power supply voltage signal pin FP2 of the driver chip 120, and the other end of the second voltage signal line VL2 is connected to the power supply outside the light-emitting substrate 100 through the bonding pins in the bonding area B and the printed circuit board, so that the power supply voltage signal from the power supply outside the light-emitting substrate 100 may be transmitted to the driver chip 120 to supply power to the driver chip 120.

For example, an orthographic projection of the conductive pattern 140 on the substrate 110 is non-overlapping with an orthographic projection of the second voltage signal line VL2 on the substrate 110. That is, there is a gap between the conductive pattern 140 and the second voltage signal line VL2.

With such the arrangement, it is possible to avoid interference or influence on the voltage signal transmitted by the second voltage signal line VL2 when the static electricity on the light-emitting substrate 100 is transmitted to the end of the conductive pattern 140 away from the first driver chip 121 through the conductive pattern 140.

In some embodiments, the conductive patterns 140 and the plurality of second voltage signal lines VL2 are made of a same material and are arranged in a same layer.

For example, both a material of the plurality of conductive patterns 140 and a material of the plurality of first voltage signal lines VL2 may be a metal material, such as copper.

With such the arrangement, the plurality of conductive patterns 140 and the plurality of second voltage signal lines VL2 are arranged in the same layer, so that the plurality of conductive patterns 140 and the plurality of second voltage signal lines VL2 may be formed through a single patterning process by using a same mask. Thus, it is possible to reduce the steps of patterning the conductive layer, thereby simplifying the manufacturing process of the light-emitting substrate 100, and reducing the number of masks. As a result, it is possible to simplify the preparation flow of the light-emitting substrate 100, reduce the cost of the light-emitting substrate 100, reduce the occurrence of short circuits and other defects in the light-emitting substrate 100, and improve the yield of the light-emitting substrate 100.

In some embodiments, a minimum distance between the conductive pattern 140 and the second voltage signal line VL2 is greater than or equal to 200 μm. For example, the minimum distance between the conductive pattern 140 and the second voltage signal line VL2 may be 200 μm, 210 μm, 220 μm, 230 μm, or 240 μm, and the embodiments of the present disclosure do not limited thereto.

With such the arrangement, it is possible to avoid the distance between the conductive pattern 140 connected to the floating pin DP and the adjacent second voltage signal line VL2 being too small to avoid interference or influence on the voltage signal transmitted by the adjacent second voltage signal line VL2 when the static electricity on the light-emitting substrate 100 is transmitted to the end of the conductive pattern 140 away from the first driver chip 121 through the conductive pattern 140, thereby improving the yield of the light-emitting substrate 100.

Figure 11:
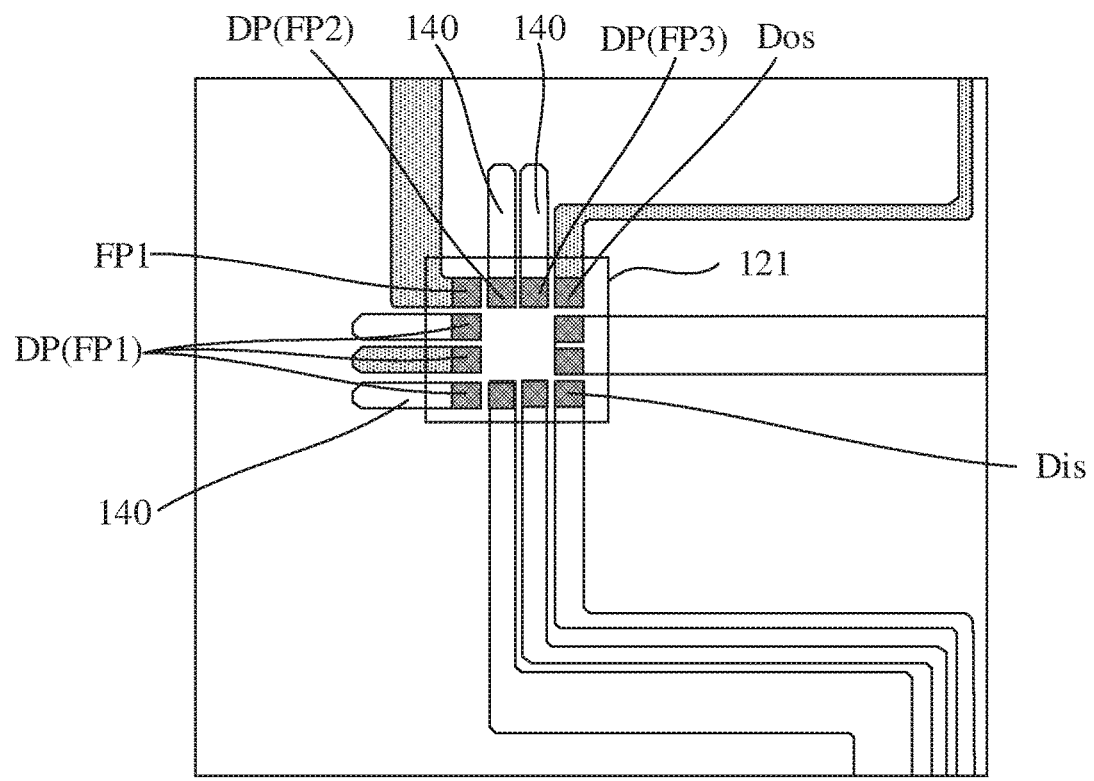
FIG. 11 is a partial enlarged view of yet another light-emitting substrate, in accordance with some embodiments of the present disclosure.

In some embodiments, as shown in FIG. 11, the first driver chip 121 includes a plurality of data signal pins FP3; the data signal pin FP3 is configured to receive a data signal; among the plurality of data signal pins FP3 of the first driver chip 121, a part of the data signal pins FP3 serves as the dummy pin DP and receives no data signal.

For example, the data signal may be transmitted to the first driver chip 121 through the data signal pin FP3.

For example, the second driver chip 122 also includes a plurality of data signal pins FP3. The number of data signal pins FP3 included in the first driver chip 121 and the number of data signal pins FP3 included in the second driver chip 122 may be the same or different, and embodiments of the present disclosure do not limit thereto.

For example, the number of data signal pins FP3 included in the first driver chip 121 is the same as the number of data signal pins FP3 included in the second driver chip 122, and both the first driver chip 121 and the second driver chip 122 have two data signal pins FP3. Among the two data signal pins FP3, one is a data input port and the other is a data output port.

Among the two data signal pins FP3 included in the first driver chip 121, one data signal pin FP3 serves as the dummy pin DP. Furthermore, the data signal pin FP3 that serves as the dummy pin DP is electrically connected to the conductive pattern 140.

With such the arrangement, the data signal pin FP3 that serves as the dummy pin DP is electrically connected to the conductive pattern 140, so that the static electricity on the light-emitting substrate 100 may be transmitted to the conductive pattern 140 electrically connected to the data signal pin FP3 through the data signal pin FP3, and then transmitted to the end of the conductive pattern 140 away from the first driver chip 121 through the conductive pattern 140, so as to prevent the static electricity on the light-emitting substrate 100 from accumulating at the first driver chip 121 to reduce the damage of the static electricity to the first driver chip 121. Thus, the anti-ESD performance of the light-emitting substrate 100 may be improved, and the dependability and reliability of the product of the light-emitting substrate 100 are improved.

In some embodiments, as shown in FIG. 7, the light-emitting substrate 100 further includes a plurality of data signal lines VL3 located between the substrate 110 and the plurality of driver chips 120; a data signal pin FP3 is electrically connected to a data signal line VL3; the conductive pattern 140 is not electrically connected to the data signal line VL3.

It will be understood that the data signal line VL3 described here is equivalent to the data signal line included in the signal lines 150 in some of the above embodiments.

For example, the plurality of data signal lines VL3 extend in the first direction X, and are arranged at intervals in the second direction Y.

For example, the data signal line VL3 is located in the functional area F.

For example, an end of the data signal line VL3 is electrically connected to the data signal pin FP3 of the driver chip 120, and the other end of the data signal line VL3 is electrically connected to the bonding pin in the bonding area B. It can be seen from the above that the driver chip 120 is electrically connected to the light-emitting device group 130, so that the data signal line VL3 may be electrically connected to the light-emitting device group 130 through the driver chip 120.

For example, an orthographic projection of the conductive pattern 140 on the substrate 110 is non-overlapping with an orthographic projection of the data signal line VL1 on the substrate 110. That is, there is a gap between the conductive pattern 140 and the data signal line VL3.

With such the arrangement, it is possible to avoid interference or influence on the voltage signal transmitted by the data signal line VL3 when the static electricity on the light-emitting substrate 100 is transmitted to an end of the conductive pattern 140 away from the driver chip 120 through the conductive pattern 140.

In some embodiments, the plurality of conductive patterns 140 and the plurality of data signal lines VL3 are made of a same material and are arranged in a same layer.

For example, both a material of the plurality of conductive patterns 140 and a material of the data signal lines VL1 may be a metal material, such as copper.

With such the arrangement, the plurality of conductive patterns 140 and the plurality of data signal lines VL3 are arranged in the same layer, so that the plurality of conductive patterns 140 and the plurality of data signal lines VL3 may be formed through a single patterning process by using a same mask. Thus, it is possible to reduce the steps of patterning the conductive layer, thereby simplifying the manufacturing process of the light-emitting substrate 100, and reducing the number of masks. As a result, it is possible to simplify the preparation flow of the light-emitting substrate 100, reduce the cost of the light-emitting substrate 100, reduce the occurrence of short circuits and other defects in the light-emitting substrate 100, and improve the yield of the light-emitting substrate 100.

In some embodiments, a minimum distance between the conductive pattern 140 and the data signal line VL3 is greater than or equal to 200 μm. For example, the minimum distance between the conductive pattern 140 and the data signal line VL3 may be 200 μm, 210 μm, 220 μm, 230 μm, or 240 μm, and the embodiments of the present disclosure do not limited thereto.

With such the arrangement, it is possible to avoid the distance between the conductive pattern 140 connected to the floating pin DP and the adjacent data signal line VL3 being too small to avoid interference or influence on the data signal transmitted by the adjacent data signal line VL3 when the static electricity on the light-emitting substrate 100 is transmitted to the end of the conductive pattern 140 away from the first driver chip 121 through the conductive pattern 140, thereby improving the yield of the light-emitting substrate 100.

In some examples, a length of the conductive pattern 140 may be in a range of 0.5 mm to 7 mm, inclusive. For example, the length of the conductive pattern 140 may be 0.5 mm, 1.5 mm, 3 mm, 5.0 mm or 7 mm, and the embodiments of the present disclosure do not limit thereto.

It will be noted that the length of the conductive pattern 140 refers to the distance between the first end of the conductive pattern 140 and the second end of the conductive pattern 140. The first end of the conductive pattern 140 is electrically connected to the first driver chip 121, and the second end of the conductive pattern 140 is the other end opposite to the first end in an extension direction of the conductive pattern 140. For example, as shown in FIG. 9, the length of the conductive pattern 140 is L.

In a case where the length L of the conductive pattern 140 is in a range of 0.5 mm to 7 mm, inclusive, it is possible to effectively reduce the damage of the static electricity on the first driver chip 121, improve the anti-ESD performance of the light-emitting substrate 100, and improve the dependability and reliability of the product of the light-emitting substrate 100.

In some embodiments, an end of the conductive pattern 140 away from the first driver chip 121 is set to be in a shape of an arc or is set to be chamfered.

It will be understood that in a case where the end of the conductive pattern 140 away from the first driver chip 121 is in a shape of an arc or is set to be chamfered, due to the rounded corner or the curved corner, it is possible to prevent the end of the conductive pattern 140 away from the first driver chip 121 from forming a sharp corner, thereby reducing the probability of tip discharge.

In some embodiments, an orthographic projection of the conductive pattern 140 on the substrate 110 is in a shape of a strip, a rectangle, a circle or an ellipse. It will be understood that the shape of the conductive pattern 140 on the substrate 110 may also be other irregular shapes, and embodiments of the present disclosure do not limit thereto. For example, as shown in FIG. 8, the orthographic projection of the conductive pattern 140 on the substrate 110 is in a shape of a rectangle.

With such the arrangement, it is possible to simplify the manufacturing process of the light-emitting substrate 100 and reduce the difficulty of manufacturing the light-emitting substrate 100.

In some embodiments, as shown in FIG. 7, the plurality of driver chips 120 are arranged in columns, and each column of driver chips 120 includes driver chips 120; the driver chips 120 in each column of driver chips 120 are cascaded in sequence.

For example, the light-emitting substrate 100 further includes a plurality of address signal lines DL located between the substrate 110 and the plurality of driver chips 120. Any two adjacent driver chips 120 in each column of driver chips 120 are connected through the address signal line DL, so that the driver chips 120 in each column of driver chips 120 are cascaded in sequence.

For example, as shown in FIGS. 8 to 11, the driver chip 120 further includes a data receiving pin Dis and a data transmission pin Dos. An end of the address signal line DL is electrically connected to the data receiving pin Dis of one of the two adjacent driver chips 120, and the other end of the address signal line DL is electrically connected to the data transmission pin Dos of the other of the two adjacent driver chips 120.

The cascade structure of the driver chips 120 in each column of driver chips 120 may be such that, in a direction from the bonding area B to the functional area F, the data receiving pin Dis of the first stage of driver chip 120 is electrically connected to the bonding pin located in the bonding area B; the data receiving pin Dis of any stage of driver chip 120, except for the first stage of driver chip 120, is electrically connected to the transmission pin Dos of the previous stage of driver chip 120 of the any stage of driver chip 120 through an address signal line DL; the data transmission pin Dos of the last stage of driver chip 120 is electrically connected to another address signal line DL. In this way, the signal output by the printed circuit board may be transmitted to the plurality of driver chips 120 through the address signal lines DL.

For example, as shown in FIG. 7, two power supply voltage signal pins FP2 of each of the first driver chip 121 and the second driver chip 122 include a power supply voltage signal input pin FP21 and a power supply voltage signal output pin FP22. In a column of driver chips 120 cascaded in sequence, the power supply voltage signal input pin FP21 of the first stage of driver chip 120 is electrically connected to the bonding pin BP located in the bonding area B; except for the first stage of driver chip 120, the power supply voltage signal input pin FP21 of any stage of driver chip 120 is electrically connected to the power supply voltage signal output pin FP22 of the previous stage of driver chip 120 of the any stage of driver chip 120 through the second voltage signal line VL2. In this case, the power supply voltage signal output pin FP22 of the last stage of driver chip 120 serves as the dummy pin DP.

For example, as shown in FIG. 7, two data signal pins FP3 of each of the first driver chip 121 and the second driver chip 122 include a data signal input pin FP31 and a data signal output pin FP32. In a column of driver chips 120 cascaded in sequence, the data signal input pin FP31 of the first stage of driver chip 120 is electrically connected to the bonding pin BP located in the bonding area B; except for the first stage of driver chip 120, the data signal input pin FP31 of any stage of driver chip 120 is electrically connected to the data signal output pin FP32 of the previous stage of driver chip 120 of the any stage of driver chip 120 through the data signal line VL3. In this case, the data signal output pin FP32 of the last stage of driver chip 120 serves as the dummy pin DP.

For example, as show in FIG. 7, the light-emitting substrate 100 further includes output lines FB. The data transmission pin Dos of the last stage of driver chip 120 in each column of driver chips 120 is electrically connected to the output line FB. The output line FB extends from the functional area F to the bonding area B, and is electrically connected to the printed circuit board outside the light-emitting substrate 100. Therefore, the signal output by the printed circuit board may be transmitted to the plurality of driver chips 120 through the address signal lines DL, and then fed back to the printed circuit board through the output line FB to drive the plurality of driver chips 120.

For example, the light-emitting substrate 100 provided by some embodiments of the present disclosure may be manufactured by the following method.

In S1, a substrate 110 is provided.

As for the material of the substrate 110, reference may be made to the description in some of the above embodiments, which will not be repeated here.

In S2, a buffer layer is formed on the substrate 110.

For example, the buffer layer is formed through chemical vapor deposition (CVD) or physical vapor deposition (PVD).

In S3, a conductive layer is formed on the buffer layer.

For example, the manufacturing method of the conductive layer is as follows: firstly, forming a conductive film layer through an electroplating process or sputtering process; the conductive film layer being made of a metal material with good conductivity, such as copper; and then, etching the conductive film layer through a photolithography process to form conductive portions in the conductive film layer.

The conductive portions refer to the first voltage signal line VL1, the second voltage signal line VL2, the data signal line VL3, the address signal line DL, the conductive pattern 140 or the connection line 160 that are mentioned in some embodiments of the present disclosure.

It will be noted that the electroplating process, sputtering process and photolithography process are only examples of the processes used in the manufacturing method, and are not used as limitations in the actual manufacturing process.

In some examples, there are two layers of conductive layers.

For example, the conductive layer may be formed by sputtering a laminate material such as molybdenum niobium alloy (MoNb)/Cu/MoNb. The bottom material of MoNb may be used to improve adhesion, the middle material of Cu is used to transmit electrical signals, and the top material of MoNb is used to prevent oxidation. Alternatively, the conductive layer may be formed by electroplating. Firstly, a seed layer molybdenum titanium nickel alloy (MoNiTi) is formed to increase the nucleation density of grains; and then, an anti-oxidation layer MoNiTi is formed after electroplating.

In S4, a passivation layer (i.e., the insulating layer mentioned in some embodiments of the present disclosure) is formed on the conductive layer.

The passivation layer is used to isolate the conductive layer from moisture and oxygen.

It will be understood that the passivation layer has a plurality of openings, and the openings expose at least part of the first voltage signal line VL1, the second voltage signal line VL2, the data signal line VL3, the address signal line DL or the connection line 160. Therefore, it is possible to achieve that, in some embodiments of the present disclosure, the driver chip 120 is electrical connected to the second voltage signal line VL2, the data signal line VL3 or the address signal line DL at the opening, or the driver chip 120 is electrically connected to the light-emitting device group 130 through the connection line 160 at the opening, or the light-emitting device group 13 is electrically connected to the first voltage signal line VL1 at the opening.

The above are only specific embodiments of the present disclosure, but the scope of protection of the present disclosure is not limited thereto, and any person skilled in the art may conceive of variations or replacements within the technical scope of the present disclosure, which shall fall within the protection scope of the present disclosure. Therefore, the protection scope of the present disclosure should be determined by the protection scope of the claims.

What is claimed is:

1. A light-emitting substrate having a functional area and a bonding area spaced apart in a first direction; the light-emitting substrate comprising:
    a substrate;
    a plurality of driver chips located on the substrate and located in the functional area, wherein the plurality of driver chips include a plurality of first driver chips and a plurality of second driver chips; among the plurality of first driver chips, at least one first driver chip is located on at least one side of the plurality of second driver chips in the first direction; a first driver chip of the plurality of first driver chips includes at least one dummy pin;
    a plurality of conductive patterns located between the substrate and the plurality of driver chips, wherein a conductive pattern of the plurality of conductive patterns is electrically connected to a dummy pin; and
    a plurality of light-emitting device groups located on the substrate, wherein
    the first driver chip further includes a plurality of channel pins, a channel pin is electrically connected to a light-emitting device group; and
    among the plurality of channel pins of the first driver chip, a part of the channel pins serves as the dummy pin and is connected to no light-emitting device group.

2. The light-emitting substrate according to claim 1, wherein a second driver chip of the plurality of second driver chips includes a plurality of channel pins, and a channel pin of the second driver chip is electrically connected to another light-emitting device group; wherein
    a number of the channel pins included in the second driver chip is the same as a number of the channel pins included in the first driver chip; and
    a number of light-emitting device groups connected to the second driver chip is greater than a number of light-emitting device groups connected to the first driver chip.

3. The light-emitting substrate according to claim 1, wherein the first driver chip includes a plurality of dummy pins, and conductive patterns connected to at least two dummy pins of the first driver chip are of a one-piece structure.

4. The light-emitting substrate according to claim 1, further comprising: a plurality of first voltage signal lines located between the substrate and the plurality of driver chips, wherein
the light-emitting device group is further electrically connected to a first voltage signal line; and
the conductive pattern is not connected to the first voltage signal line.

5. The light-emitting substrate according to claim 4, wherein the plurality of conductive patterns and the plurality of first voltage signal lines are made of a same material and are arranged in the same layer.

6. The light-emitting substrate according to claim 4, wherein a minimum distance between the conductive pattern and the first voltage signal line is greater than or equal to 200 µm.

7. The light-emitting substrate according to claim 1, wherein the first driver chip further includes a plurality of power supply voltage signal pins, and a power supply voltage signal pin is configured to receive a power supply voltage signal;
among the plurality of power supply voltage signal pins of the first driver chip, a part of the power supply voltage signal pins serves as the dummy pin and is configured to receive no power supply voltage signal.

8. The light-emitting substrate according to claim 1, wherein the first driver chip further includes a plurality of data signal pins, and a data signal pin is configured to receive a data signal; and
among the plurality of data signal pins of the first driver chip, a part of the data signal pins serves as the dummy pin and is configured to receive no data signal.

9. The light-emitting substrate according to claim 8, further comprising: a plurality of data signal lines located between the substrate and the plurality of driver chips, wherein
the data signal pin is electrically connected to a data signal line; and
the conductive pattern is not connected to the data signal line.

10. The light-emitting substrate according to claim 9, wherein the conductive patterns and the data signal lines are made of a same material and are arranged in a same layer; and/or
a minimum distance between the conductive pattern and the data signal line is greater than or equal to 200 µm.

11. The light-emitting substrate according to claim 1, wherein an end of the conductive pattern away from the first driver chip is in a shape of an arc or is chamfered; or
an orthographic projection of the conductive pattern on the substrate is in a shape of a strip, a rectangle, a circle or an ellipse.

12. The light-emitting substrate according to claim 1, wherein the plurality of driver chips are arranged in columns, and each column of driver chips includes driver chips; the driver chips in each column of driver chips are cascaded in sequence.

13. The light-emitting substrate according to claim 1, wherein at least one first driver chip is located on one side of the plurality of second driver chips in the first direction.

14. The light-emitting substrate according to claim 1, wherein at least one first driver chip is closer to the bonding area than the plurality of second driver chips, and another at least one first driver chip is further away from the bonding area than the plurality of second driver chips.

15. A backlight module, comprising: the light-emitting substrate according to claim 1, and an optical film located on a light exit side of the light-emitting substrate.

16. A display apparatus, comprising:
the backlight module according to claim 15; and
an array substrate located on a light exit side of the backlight module; and
a color filter substrate located on a side of the array substrate away from the backlight module.

17. A light-emitting substrate having a functional area and a bonding area spaced apart in a first direction;
the light-emitting substrate comprising:
a substrate;
a plurality of driver chips located on the substrate and located in the functional area, wherein the plurality of driver chips include a plurality of first driver chips and a plurality of second driver chips;
among the plurality of first driver chips, at least one first driver chip is located on at least one side of the plurality of second driver chips in the first direction;
a first driver chip of the plurality of first driver chips includes at least one dummy pin; and
a plurality of conductive patterns located between the substrate and the plurality of driver chips, wherein a conductive pattern of the plurality of conductive patterns is electrically connected to a dummy pin; wherein
the first driver chip further includes a plurality of power supply voltage signal pins, and a power supply voltage signal pin is configured to receive a power supply voltage signal; and
among the plurality of power supply voltage signal pins of the first driver chip, a part of the power supply voltage signal pins serves as the dummy pin and is configured to receive no power supply voltage signal.

18. The light-emitting substrate according to claim 17, further comprising: a plurality of second voltage signal lines located between the substrate and the plurality of driver chips, wherein
the power supply voltage signal pin is electrically connected to a second voltage signal line; and
the conductive pattern is not connected to the second voltage signal line.

19. The light-emitting substrate according to claim 18, wherein the conductive patterns and the plurality of second voltage signal lines are made of a same material and are arranged in a same layer.

20. The light-emitting substrate according to claim 18, wherein a minimum distance between the conductive pattern and the second voltage signal line is greater than or equal to 200 µm.

* * * * *